US007020571B2

(12) United States Patent
Lee

(10) Patent No.: US 7,020,571 B2
(45) Date of Patent: Mar. 28, 2006

(54) AUTOMATED TEST METHOD

(75) Inventor: Yung-Chien Lee, Taipei (TW)

(73) Assignee: Inventec Corporation, Taipei (TW)

(*) Notice: Subject to any disclaimer, the term of this patent is extended or adjusted under 35 U.S.C. 154(b) by 149 days.

(21) Appl. No.: 10/720,076

(22) Filed: Nov. 25, 2003

(65) Prior Publication Data
US 2004/0179413 A1 Sep. 16, 2004

(30) Foreign Application Priority Data
Mar. 10, 2003 (TW) .............................. 92105069 A

(51) Int. Cl.
G01R 31/28 (2006.01)

(52) U.S. Cl. ........................ 702/119; 702/57; 702/64; 702/65; 324/536; 714/724

(58) Field of Classification Search ................. 702/57, 702/64, 65, 119, 122, 123; 324/73.1, 511, 324/536, 538, 539, 540, 541, 544, 551; 714/46, 714/47, 48, 49, 50, 51, 719, 720, 724
See application file for complete search history.

(56) References Cited

U.S. PATENT DOCUMENTS

| | | | | |
|---|---|---|---|---|
| 4,120,629 A | * | 10/1978 | Christian et al. ...... | 198/341.02 |
| 4,434,489 A | * | 2/1984 | Blyth ........................... | 714/46 |
| 4,841,456 A | * | 6/1989 | Hogan et al. ............... | 702/119 |
| 6,011,398 A | * | 1/2000 | Bald et al. .................. | 324/511 |
| 6,054,865 A | * | 4/2000 | Bald et al. .................. | 324/551 |
| 6,292,006 B1 | * | 9/2001 | Fredrickson ................ | 324/754 |
| 6,442,639 B1 | * | 8/2002 | McElhattan et al. ........ | 710/303 |
| 6,453,435 B1 | * | 9/2002 | Limon et al. ............... | 714/724 |
| 6,515,484 B1 | * | 2/2003 | Bald et al. .................. | 324/551 |
| 6,744,259 B1 | * | 6/2004 | Bald .......................... | 324/551 |
| 6,815,956 B1 | * | 11/2004 | Weldin et al. ............. | 324/536 |
| 6,815,959 B1 | * | 11/2004 | Johnson et al. ............ | 324/718 |
| 6,877,211 B1 | * | 4/2005 | Machado ................... | 29/602.1 |
| 2001/0054902 A1 | * | 12/2001 | Smith et al. ................ | 324/544 |
| 2003/0234652 A1 | * | 12/2003 | Bald .......................... | 324/551 |
| 2004/0145374 A1 | * | 7/2004 | Weldin et al. ............. | 324/536 |

* cited by examiner

Primary Examiner—Carol S. W. Tsai
(74) Attorney, Agent, or Firm—Birch, Stewart, Kolasch & Birch, LLP

(57) ABSTRACT

An automated test method for performing a hi-pot test procedure for an electrical device through the use of a test program installed in a factory information system (FIS) and a test instrument connected to the FIS. The test program sends a control command to the test instrument that in turn executes the hi-pot test for the electrical device. Test results are obtained by the test program from the test instrument and sent to the FIS. The test results are stored in the FIS for future reference.

10 Claims, 6 Drawing Sheets

FIG. 3A

| Serial No. | 987654321 | Account No. | | | |
|---|---|---|---|---|---|
| Part NO | Type | Qty | | | |
| | | | | | |
| Data | | | Date | | |
| Mode | | | Qty | | |
| X shift | 10 | | Y shift | 10 | Enter |

Start

AUTOMATED TEST METHOD

This nonprovisional application claims priority under 35 U.S.C. § 119(a) on Patent Application No(s). 092105069 filed in Taiwan, R.O.C. on Mar. 10, 2003, the entire contents of which are hereby incorporated by reference.

FIELD OF THE INVENTION

The present invention relates to methods for testing product characteristics, and more particularly, to an automated test method for testing voltage tolerance of a electrical device.

BACKGROUND OF THE INVENTION

Electrical device manufacturers take cautious steps to ensure safety, quality, and the reputation of their products by employing a variety of rigorous functional tests, such as temperature test, water-proof test, conductivity test, insulation test, and hi-pot test. Each test represents assurance for an important product characteristic and is an indispensable step in the whole quality control procedure before the electrical device is delivered and distributed to all franchised stores for sale. Among all the test items mentioned above, the hi-pot test for testing voltage tolerance merits an extra attention over the others due to safety concerns, since functions of the electrical device are operated by inputting voltage to drive operation of the electrical device. Therefore, the test result obtained by following accurate and thorough test procedure becomes a critical factor for determining whether the electrical device has an ability to withstand a voltage overload. If the electrical device is not subject to a complete hi-pot test procedure, it creates safety doubt for the user. Hence, the electrical device manufacturers are responsible for performing strict safety checks of their products before shipment, so as to guarantee product safety for the users, and to further maintain good manufacturer credibility for the consumers.

Currently, manufacturers for the electrical devices execute the hi-pot test procedure on electrical or electronic devices in their production lines by having the operators manually operate the test instrument. The operators then sort out those passed or failed devices based on their test results, and scan the bar code of each device to record the test results in a Factory Information System (FIS) for quality control reference.

In practice, the speed, efficiency, and accuracy of performing the test procedure manually largely depend on the consistency and steadiness of the operators. Hi-pot testing is a highly repetitive and mind-numbing task that easily fatigues the operators and creates uncertainties, which would result in defects and inaccuracies in the entire test process. In many respects, the manual way of conducting the test can no longer satisfy the precise and accurate requirements needed to ensure quality of the current electrical products which are usually assembled by complex interconnection of a variety of electrical modules into compact electrical devices of high reliability.

SUMMARY OF THE INVENTION

An objective of the present invention is to provide an automated test method, which automatically performs a hi-pot test for an electrical device, without using manpower and thereby reducing the time and cost for fabricating the electrical device.

Another objective of the invention is to provide an automated test method, which can truly perform the hi-pot test for every electrical device to be tested, such that incomplete or inaccurate test operation by artificial errors can be avoided, thereby improving the accuracy and efficiency of the test performance for the electrical device and assuring the quality of the fabricated electrical device.

In accordance with the above and other objectives, the present invention proposes an automated test method. First, a hi-pot test program is stored in an operating system such as factory information system (FIS), so as to allow the FIS operative with the hi-pot test program to test voltage tolerance or perform a hi-pot test for an electrical device to be tested by a test instrument. The automated test method includes the following steps. First, the FIS verifies whether a serial number of the device is consistent with a serial number, of a desired electrical device to be tested, input by a user or not; if yes, the FIS transforms the serial number of the electrical device into a file and stores it in a predetermined folder of the FIS; if no, the electrical device is not subject to the hi-pot test. The next step is to have the FIS urge its hi-pot test program and shift control of the hi-pot test to the test program. Then, the test program read the stored file of the serial number of the electrical device from the FIS. The test program detects whether a first connection port of the FIS can establish a connection to the test instrument or not; if yes, the test program initializes the first connection port to establish the connection between the first connection port and the test instrument; if no, the test program switches to establish a connection between a second connection port of the FIS and the test instrument. Once the connection between the FIS and the test instrument is established, the test program sends a control command via the connection to the test instrument to execute the hi-pot test for the electrical device. Finally, the test program uses a remote control function thereof and the control command to read test results of the electrical device shown on a LCD (liquid crystal display) of the test instrument, and then sends the test results to the FIS through the connection between the FIS and the test instrument to store the test results in the predetermined folder of the FIS, the test results serving as future reference. At the same time, the test program returns the control of the hi-pot test back to the FIS, and a message indicating whether test performance succeeds or not is shown via the FIS to the user.

Therefore, the automated test method according to the invention can automatically carry out a hi-pot test for an electrical device to be tested in an accurate and efficient manner. This thereby eliminates the prior-art drawbacks caused by manual operation of the hi-pot test, for example, inefficient and inaccurate test performance under human control, etc. Since the hi-pot test performed by the automated test method would be thoroughly conducted for each electrical device, such that test faults, such as missed inspection and wrong inspection caused by human error, can be prevented, thereby ensuring quality and safe operation of the fabricated electrical devices. In the absence of human errors, each electrical device can be accurately and precisely tested, thereby improving the production yield and saving costs to remedy the human errors.

BRIEF DESCRIPTION OF THE DRAWINGS

The present invention can be more fully understood by reading the following detailed description of the preferred embodiments, with reference made to the accompanying drawings, wherein:

FIGS. 3A to 3D are schematic diagrams showing the screen pictures of test procedures for the motherboard using the automated test method according to the invention.

DETAILED DESCRIPTION OF THE PREFERRED EMBODIMENT

The following preferred embodiment in detail describes the use of an automated test method according to the present invention to automatically test voltage tolerance or perform a hi-pot test for an electrical device such as, but not limited to, motherboard, in an accurate and efficient manner.

Figure 1:
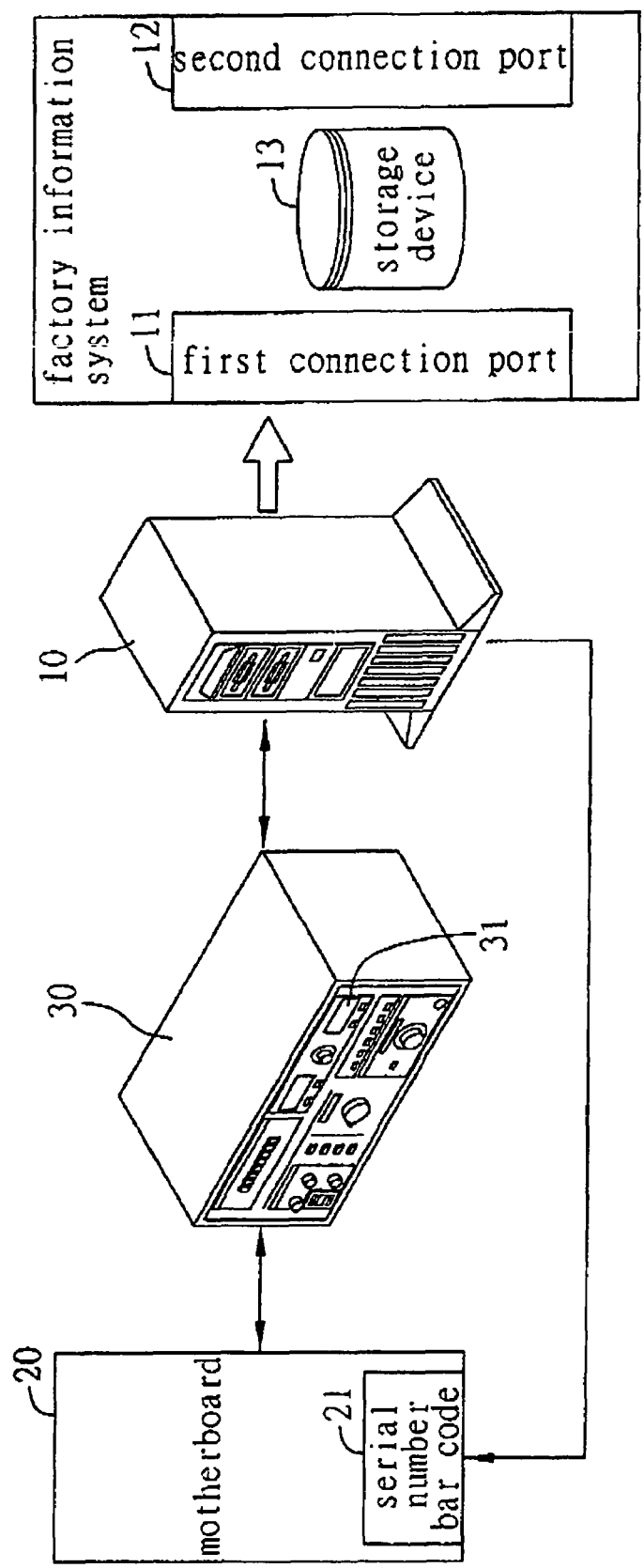
FIG. 1 is a schematic diagram showing operating architecture for performing a hi-pot test for a motherboard using an automated test method according to the invention.

FIG. 1 illustrates operating architecture for performing the hi-pot test for the motherboard 20 using the automated test method according to the invention. The operating architecture includes an operating system such as Factory Information System (FIS) 10, a hi-pot test instrument 30, and the motherboard 20. The FIS 10 reads a serial number bar code 21 on the motherboard 20, and stores the serial number of the motherboard 20 as a file in a predetermined folder of a storage device 13 of the FIS 10 once the serial number is verified being correct. A hi-pot test program installed in the FIS 10 is urged to read the file of the serial number and to initialize a first connection port 11 (e.g. a RS-232 connection port) of the FIS 10 to establish a connection between the first connection port 11 and the test instrument 30. If the connection between the first connection port 11 and the test instrument 30 fails, the test program establishes a connection between a second connection port 12 (e.g. a RS-232 connection port) of the FIS 10 and the test instrument 30. Then, the test program sends a control command to the test instrument 30 via the RS-232 connection between the FIS 10 and the test instrument 30, such that the test instrument 30 can start performing the hi-pot test for the motherboard 20. During the hi-pot test, the test program of the FIS 10 uses a remote control function thereof and the control command to read test results of the motherboard 20, and sends the test result back to the FIS 10 to store the test results in the predetermined folder of the storage device 13, the test results serving as future reference.

Figure 2:
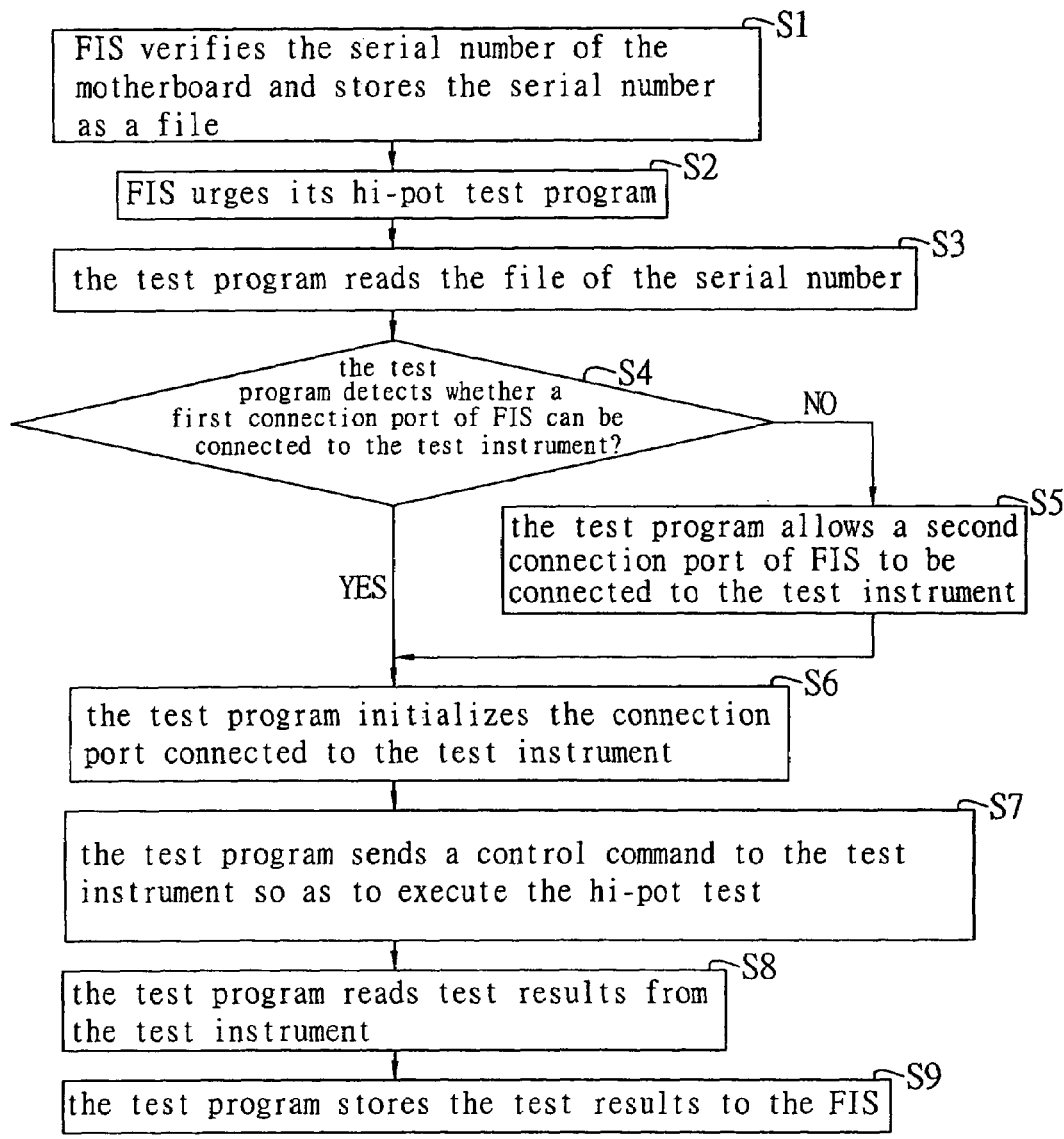
FIG. 2 is a flow chart showing the steps of the automated test method according to the invention to perform the hi-pot test for the motherboard.
Figure 3B:
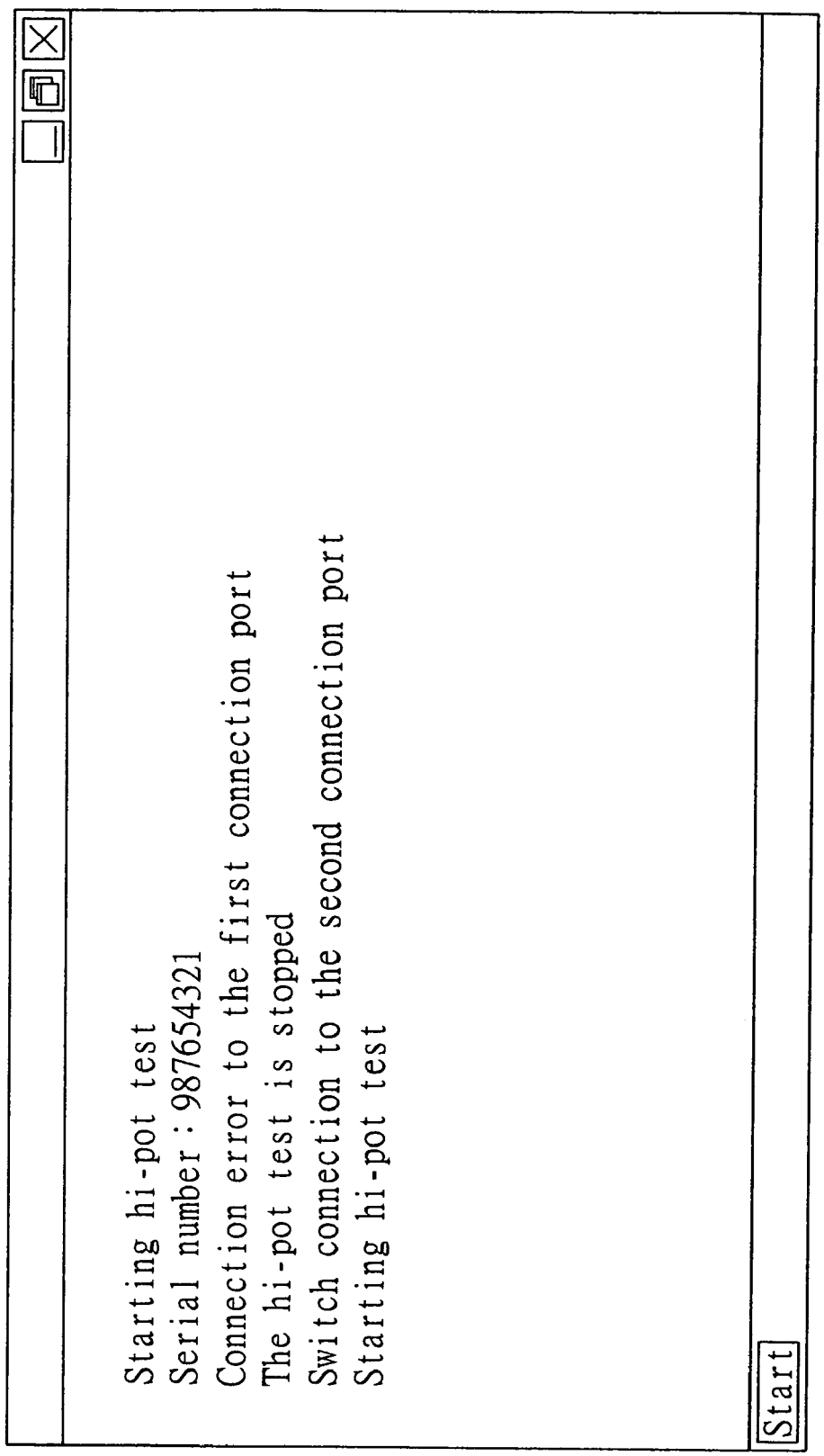

FIG. 2 illustrates the steps of the automated test method according to the invention to perform the hi-pot test for the motherboard 20, which are described also with reference to FIGS. 3A to 3D. As shown in FIG. 3A, in step S1, the FIS 10 prompts a user to input a serial number of a motherboard to be tested. Once the user inputs the intended serial number, the FIS 10 verifies whether the serial number bar code 21 of the motherboard 20 on the hi-pot test instrument 30 is consistent with the serial number input by the user or not. If yes, the FIS 10 stores the serial number as a file in a predetermined folder of the storage device 13 thereof, and stores the file in a storage device 13 in the FIS 10; then, it proceeds to step S2. If no, the motherboard 20 is not subject to the hi-pot test.

In step S2, the FIS 10 urges a hi-pot test program installed therein and shifts control of the hi-pot test, to be performed for the motherboard 20, to the test program. Then, it proceeds to step S3.

In step S3, the test program determines and reads the file of the serial number of the motherboard 20 stored in the storage device 13. If the file exists, the test program starts executing the hi-pot test for the motherboard 20 through the use of the test instrument 30. Then, it proceeds to step S4.

In step S4, the test program detects whether the first connection port 11 of the FIS 10 can establish a connection to the test instrument 30 or not. If yes, it proceeds to step S6; if no, it proceeds to step S5.

In step S5, the test program automatically switches to allow the second port 12 of the FIS 10 to establish a connection to the test instrument 30, and informs the user of this event by means of a message shown in FIG. 3B on a display of the FIS 10. Then, it proceeds to S6.

In step S6, the test program initializes the connection port 11 or 12 of the FIS 10 which is connected to the test instrument 30 to establish the connection between the FIS 10 and the test instrument 30. Then, it proceeds to step S7.

Figure 3C:
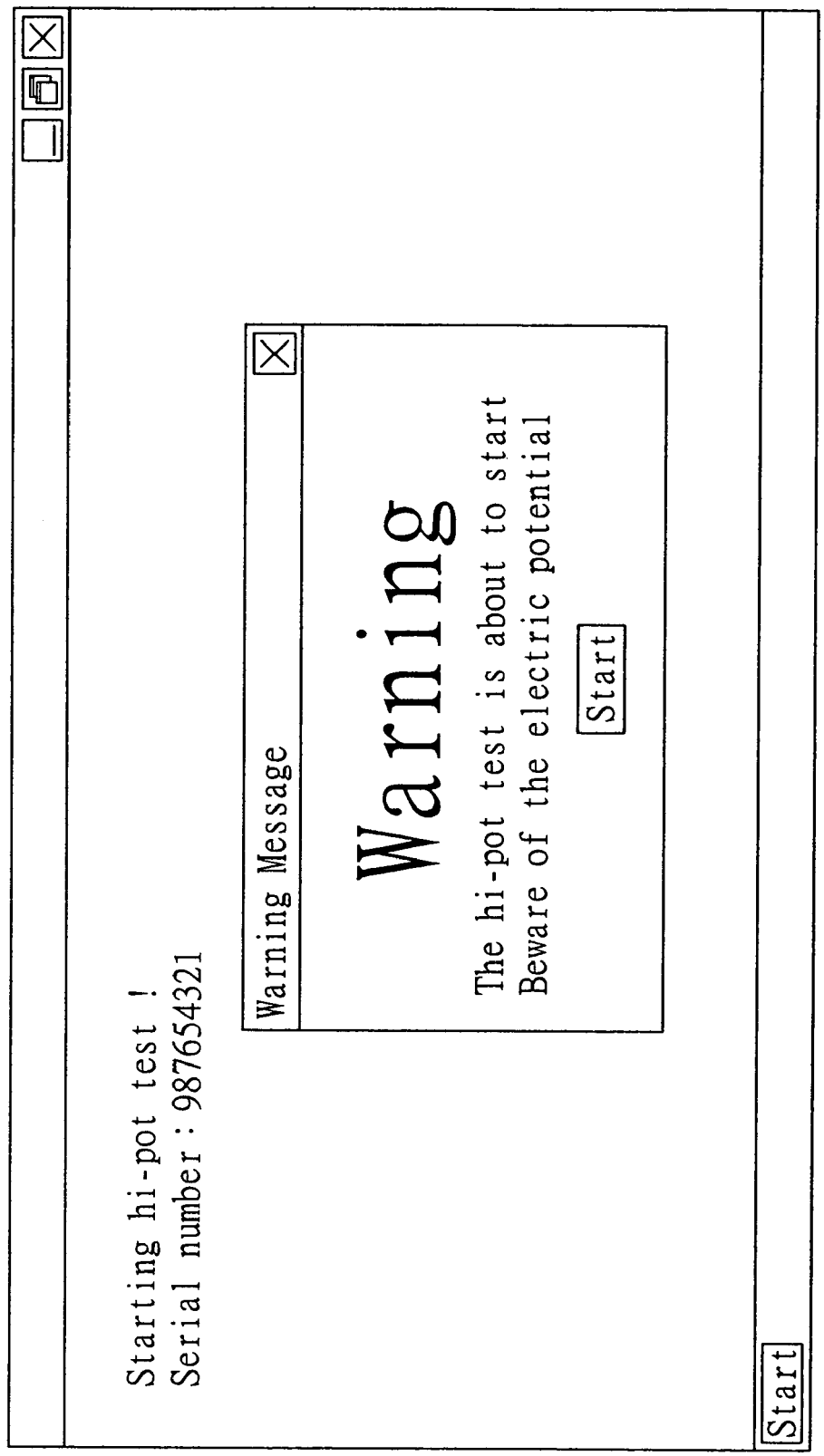

In step S7, after the connection between the FIS 10 and the test instrument 30 is established, the test program sends a control command via the connection to the test instrument 30. As a result, the test instrument 30 can start executing the hi-pot test for the motherboard 20, and a warning message is shown in FIG. 3C on the display of the FIS 10 to inform the user of the hi-pot test for the motherboard 20 going to be started soon. Then, it proceeds to step S8.

In step S8, the test program uses a remote control function thereof and the control command sent to the test instrument 30 to read test results of the motherboard 20 shown on a LCD (liquid crystal display) 31 of the test instrument 30, and sends the test results back to the FIS 10 through the connection between the FIS 10 and the test instrument 30. Then, it proceeds to step S9.

Figure 3D:
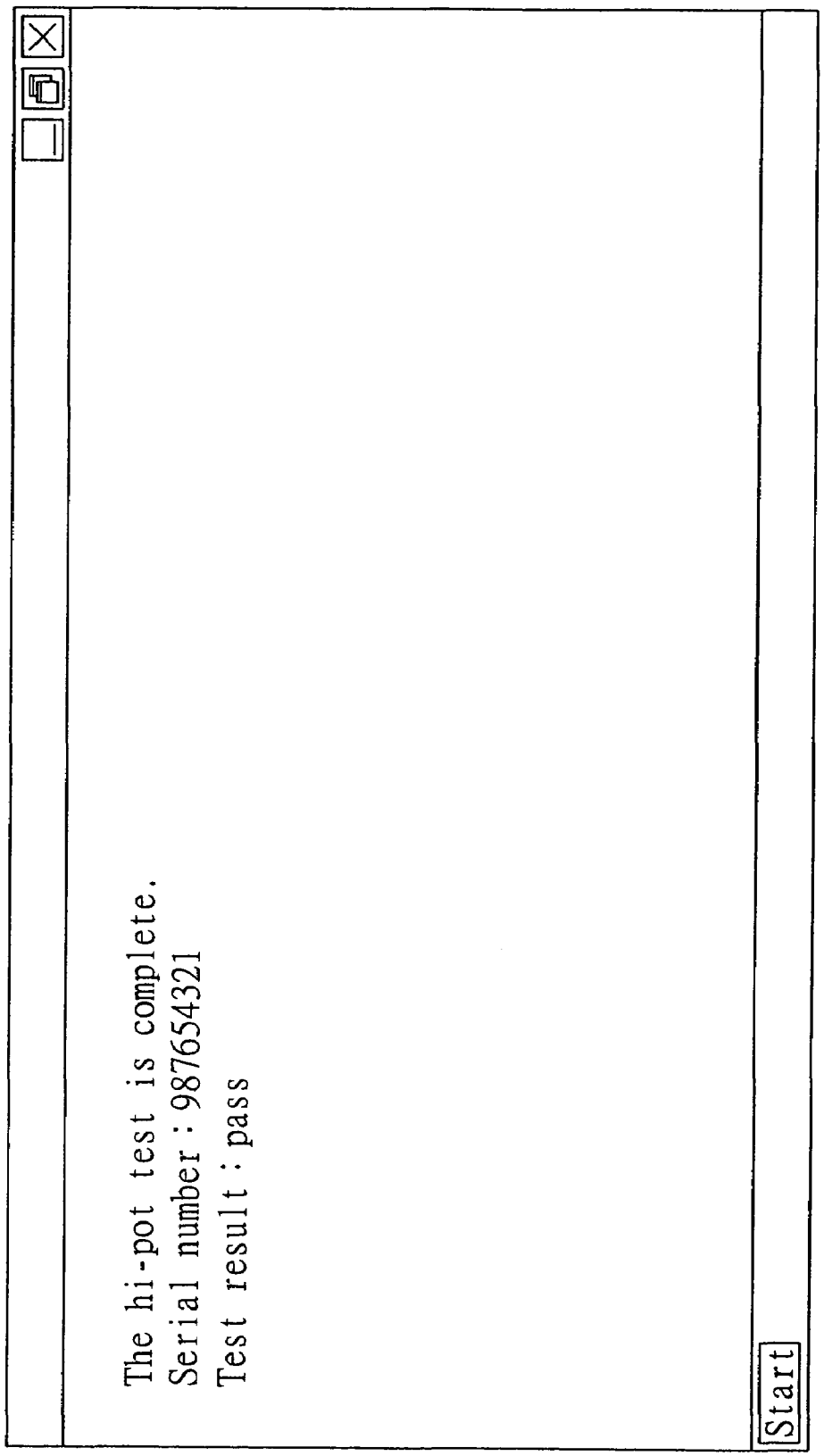

In step S9, until the test instrument 30 provides a message indicating whether the hi-pot test for the motherboard 20 succeeds or fails to the test program, the test program stores the test results to the predetermined folder of the storage device 13 in the FIS 10 for future reference in the use of the control command sent to the test instrument 30. Meanwhile, the test program returns the control of the hi-pot test back to the FIS 10, and a message indicating whether the hi-pot test succeeds or not is shown in FIG. 3D on the display of the FIS 10 to the user.

Therefore, the automated test method according to the invention can automatically carry out a hi-pot test for an electrical device to be tested in an accurate and efficient manner. This thereby eliminates the prior-art drawbacks caused by manual operation of the hi-pot test, for example, inefficient and inaccurate test performance under human control, etc. Since the hi-pot test performed by the automated test method would be thoroughly conducted for each electrical device, such that test faults, such as missed inspection and wrong inspection caused by human error, can be prevented, thereby ensuring quality and safe operation of the fabricated electrical devices. In the absence of human errors, each electrical device can be accurately and precisely tested, thereby improving the production yield and saving costs to remedy the human errors.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An automated test method for testing voltage tolerance of an electrical device via an operating system connected to and operative with a test instrument, the operating system being connected via one of a first connection port and a second connection port thereof to the testing instrument to perform a hi-pot test for the electrical device, the method comprising the steps of:

(1) having the operating system read and verify a serial number of the electrical device to store the serial number as a file in a predetermined folder of the operating system if the serial number is correct;

(2) having the operating system urge a test program installed therein to read the stored file of the serial number of the electrical device;

(3) establishing via the test program a connection between the test instrument and the first connection port of the operating system, and sending a control command to the test instrument via the connection between the operating system and the test instrument, so as to allow the test instrument to perform the hi-pot test for the electrical device; and, (4) having the test program read test results of the electrical device from the test instrument using the control command, and store the test results in the predetermined folder of the operating system.

2. The automated test method of claim 1, wherein the operating system is a Factory Information System (FIS).

3. The automated test method of claim 1, wherein the test instrument is a hi-pot test instrument having a remote control function.

4. The automated test method of claim 1, wherein the operating system reads the serial number of the electrical device from a bar code on the electrical device.

5. The automated test method of claim 1, wherein the test program is a hi-pot test program.

6. The automated test method of claim 1, wherein the operating system allows the test program to control the hi-pot test when the test program is urged by the operating system.

7. The automated test method of claim 1, further comprising a step of having the test program initialize the first connection port of the operating system to establish the connection between the test instrument and the first connection port before the step (3).

8. The automated test method of claim 7, wherein the test program switches to establish a connection between the test instrument and the second connection port of the operating system if the connection between the test instrument and the first connection port fails.

9. The automated test method of claim 1, wherein the first connection port and the second connection port are each a RS-232 connection port.

10. The automated test method of claim 6, further comprising a step of having the test program return the control of the hi-pot test back to the operating system after the step (4).

* * * * *